United States Patent
Ishibashi

(10) Patent No.: US 7,505,316 B2
(45) Date of Patent: Mar. 17, 2009

(54) DATA STORAGE HAVING FUNCTION TO PROTECT STORED DATA

(75) Inventor: Osamu Ishibashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 55 days.

(21) Appl. No.: 11/740,811

(22) Filed: Apr. 26, 2007

(65) Prior Publication Data

US 2007/0195599 A1    Aug. 23, 2007

Related U.S. Application Data

(62) Division of application No. 11/335,610, filed on Jan. 20, 2006, now Pat. No. 7,342,834.

(30) Foreign Application Priority Data

Oct. 13, 2005    (JP) .............................. 2005-299201

(51) Int. Cl.
G11C 16/04    (2006.01)
(52) U.S. Cl. .................... 365/185.04; 711/156
(58) Field of Classification Search ............ 365/185.04; 711/156
See application file for complete search history.

(56) References Cited

U.S. PATENT DOCUMENTS 6,324,626 B1 *  11/2001  Uenoyama et al. .......... 711/163
6,504,765 B1     1/2003  Joo

FOREIGN PATENT DOCUMENTS

| JP | 5-88986 | 4/1993 |
| JP | 9-16477 | 1/1997 |
| JP | 10-320293 | 12/1998 |
| JP | 11-328036 | 11/1999 |
| JP | 2000-47947 | 2/2000 |
| JP | 2001-195307 | 7/2001 |
| JP | 2001-202167 | 7/2001 |
| JP | 2002-73422 | 3/2002 |
| JP | 10-2004-0087794 | 10/2004 |
| KR | 2003-0041007 | 5/2003 |
| KR | 2004-0087794 | 10/2004 |

* cited by examiner

*Primary Examiner*—Hoai V Ho
(74) *Attorney, Agent, or Firm*—Staas & Halsey LLP

(57) ABSTRACT

A data storage includes a part of functioning for, when data reading operation is carried out on a storage part storing data for a case where the data storage is handled in a predetermined manner, causing predetermined data different from target data to be read out instead of the target data.

6 Claims, 7 Drawing Sheets

DATA STORAGE HAVING FUNCTION TO PROTECT STORED DATA

CROSS-REFERENCE TO RELATED APPLICATIONS

This application is a Divisional Application of Ser. No. 11/335,610 filed Jan. 20, 2006, now issued as U.S. Pat No. 7,342,834, and claims the benefit of Japanese Priority Application No. 2005-299201, filed on Oct. 13, 2005, the entire contents of which are hereby incorporated herein by reference.

BACKGROUND OF THE INVENTION

1. Field of the Invention

The present invention relates to a data storage, and, in particular, to a data storage for which security can be effectively improved for stored information.

2. Description of the Related Art

Recently leakage, robbery or such, of information to be protected, such as personal information, confidential information or such, has taken an attention as a social problem. As a result, countermeasures are demanded for various types of information processing apparatuses which handle such information to be protected.

Information to be protected may include, for example, information for identifying a person, such as a residence, a name or such, information applied for personal authentication such as fingerprint, password or such.

Such information to be protected is for example stored in a memory or a data storage in an information processing apparatus. In such a case, an appropriate countermeasure against data leakage should be taken for the memory or the data storage.

Memories or data storages used in information processing apparatuses may be roughly classified into two types, i.e., volatile memories and nonvolatile memories. The nonvolatile memories are configured such that, as well-known, stored data is held even without power supply.

The present application is based on Japanese Priority Application No. 2005-299201, filed on Oct. 13, 2005, the entire contents of which are hereby incorporated herein by reference.

SUMMARY OF THE INVENTION

For example, in a fingerprint authentication system as one example of a system handling personal information as information to be protected, fingerprint information as personal information may be stored in such a nonvolatile memory. When the nonvolatile memory is stolen, a serious problem may occur, i.e., leakage of personal information to be protected.

As a method of protecting information to be protected, enciphering of the relevant information may be cited. However, in this method, deciphering may be made by an unauthorized person as a result of an enciphering algorithm being analyzed.

The present invention has been devised in consideration of this problem, and an object of the present invention is to provide a data storage for which, even when the data storage storing information to be protected is stolen, unauthorized use of the information to be protected can be effectively prevented.

In order to achieve this object, according to the present invention, a data storage includes a semiconductor storage in which hot carriers are injected in such a manner that stored data is erased when the semiconductor storage is handled in a predetermined manner.

Alternatively, a data storage includes a part of functioning for responding to data reading operation carried out on a storage part storing data to cause predetermined data, different from target data, to be read out instead of the target data.

In the former configuration, hot carriers are previously injected in a semiconductor storage, and, for example, a configuration may be made such that exposure of the semiconductor storage to outside light is prevented when the semiconductor storage is set in a proper state, while, when the semiconductor storage is removed from the proper state without a special concern, the semiconductor storage is exposed to outside light, whereby stored data is erased by a function of the hot carriers.

As a result, even with a simple configuration, stored data can be positively erased automatically when the data storage is stolen or so (whereby the data storage is handled in the predetermined manner, i.e., the data storage is removed without a special concern).

In the latter configuration, data different from target data can be made to be read out when the data storage is stolen or so. In this configuration, an unauthorized person may believe that he or she obtained the target data even when actually different data is thus read out.

Thus, according to the present invention, when a data storage is stolen or so, stored data is automatically erased or different data is read out. As a result, unauthorized use of information to be protected can be effectively prevented.

BRIEF DESCRIPTION OF THE DRAWINGS

Other objects and further features of the present invention will become more apparent from the following detailed description when read in conjunction with the accompanying drawings.

DETAILED DESCRIPTION OF THE PREFERRED EMBODIMENTS

Figure 1:
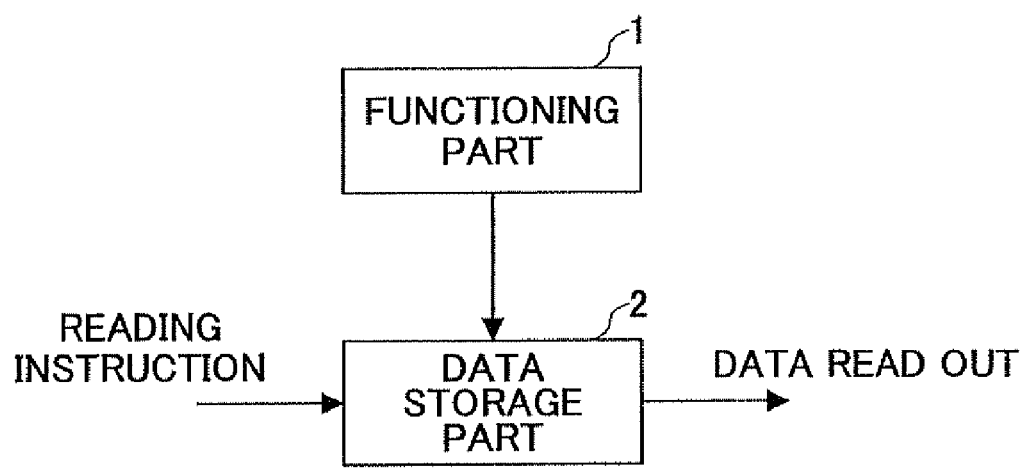
FIG. 1 shows a principle diagram of the present invention.

A data storage according to each embodiment of the present invention includes, as shown in FIG. 1, a data storage part 2 storing information to be protected and a functioning part 1 functioning on the storing part 1.

When the data storage is handled in a predetermined manner, i.e., when, for example, a semiconductor storage as the data storage is removed from a printed substrate without a special concern, or so, the functioning part 1 responds thereto to function on the data storage part 2 for a predetermined effect.

The predetermined effect may be one of automatically erasing, destroying, or replacing stored data in the data storage part 2, for example.

That is, an embodiment of the present invention is a semiconductor integrated circuit having a nonvolatile memory configured in such a manner that, when the nonvolatile memory as the data storage part 2 storing information to be protected is removed for an illegal purpose, or illegal reading out of the stored information is attempted, the stored data automatically enters a state such that reading out thereof is not allowed, or further, the stored data is automatically replaced with other predetermined data.

Further, it is preferable that the above-mentioned other predetermined data with which the original information is thus replaced is connected to a communication function, a notification function or such. Thereby, a predetermined external organization can be automatically notified of an occurrence of such an illegal action.

According to a first mode of carrying out the present invention, a window or an opening is provided on, for example, a bottom of a package of a nonvolatile memory, that is, a so-called a memory with a window, described later, is realized. As a result, when the package of the nonvolatile memory is mounted on a printed substrate in such a manner that the bottom thereof is covered by a surface of the printed substrate, the window or the opening provided thereto is blocked thereby, and thus, the window or the opening is prevented from being exposed to outside light.

On the other hand, when this package of the nonvolatile memory is removed from the printed substrate without any special concern, the window or the opening, provided to the bottom thereof, is exposed to outside light accordingly. As a result, the nonvolatile memory, inside the package, is exposed to outside light via the window or the opening. Then, energy of the outside light functions to the nonvolatile memory to automatically erase the stored data.

In order to achieve this function, such an amount of hot carriers are previously injected in the nonvolatile memory that, even slight exposure of the nonvolatile memory to outside light may cause erasure of the stored data, while the hot carriers should not influence a regular use of a memory cell included in the nonvolatile memory.

Technology (so-called UV-EPROM) of causing data erasure in such a nonvolatile memory due to ultraviolet irradiation is known. In order to cause the same effect even with ordinary light other than ultraviolet ray, a predetermined amount of hot carriers are previously injected as mentioned above.

Technology of data erasure with the use of hot carriers is mentioned, for example, by 'a hot carrier mechanism is applied to an erasure method, . . . ' in an item '(2) for employment of low cost flash memory process technology' in 'for development of 'World's first 32-bit RISC-type microcontroller having a flash memory built therein', by NEC ELECTRONICS, NEC, Mar. 12, 1996 (URL: http://www.nec.co.jp/press/ja/9603/1202.html, Oct. 4, 2005).

Further, technology for reducing an write/erase operation voltage and achieving high speed operation by employing hot carriers is mentioned in an item of 'principle and configuration of MONOS' in a column of 'space traveling device, low-cost mixing-use nonvolatile memory device technology "MONOS"' by SONY (URL: http://www.sony.co.jp/Products/SC-HP/cx_pal/vol52/pdf/monos_f.pdf, Oct. 4, 2005).

From these known technologies, it is seen that a voltage required for driving electrons can be reduced with the use of hot carriers, and thereby, electrons even can be driven even with low energy. That is, it is seen that, by injecting hot carriers in a semiconductor memory, energy required for erasing data can be reduced.

Further, as described in an item of 'UV-EPROM (ultraviolet erasable PROM)' of a column 'EPROM, from: free encyclopedia "Wikipedia"' (URL: http://ja.wikipedia.org/wiki/EPROM: Oct. 4, 2005), technology of achieving data erasure by exciting electrons with ultraviolet irradiation so that they may penetrate a gate insulating film is known.

In the first mode of carrying out the present invention, this technology is applicable, and, in order to achieve data erasure in a semiconductor memory even with ordinary outside light other than ultraviolet ray, hot carriers are injected, and thus, energy required for driving electrons can be reduced.

That is, in order to achieve data erasure thanks to outside light irradiation due to an effect the same as that of the well-known data erasure mechanism in an UV-EPROM, a configuration should be provided such that electrons excited by outside light can easily penetrate a gate insulating film of a semiconductor memory. For this purpose, hot carriers, having an effect of easily driving electrons as mentioned above, are injected. That is, the effect of reducing energy required for driving electrons in a semiconductor memory by injecting hot carriers mentioned above is utilized. As a result, a semiconductor memory for which stored data can be erased when the memory is exposed to ordinary outside light other than ultraviolet ray can be obtained.

Especially, as will be descried later for a third embodiment, in the first mode of carrying out the present invention, a so-called memory with a window, the same as the above-mentioned well-known UV-EPROM, is applied. A configuration of this 'memory with a window' is described as 'a quartz glass made window is provided to a package of an UV-EPROM for applying ultraviolet ray' in a column 'UV-EPROM (ultraviolet erasable PROM)' of the above-mentioned column 'EPROM, from: free encyclopedia "Wikipedia"' (URL: http://ja.wikipedia.org/wiki/EPROM: Oct. 4, 2005).

Next, a data storage in a second mode of carrying out the present invention is described now.

Figure 2:
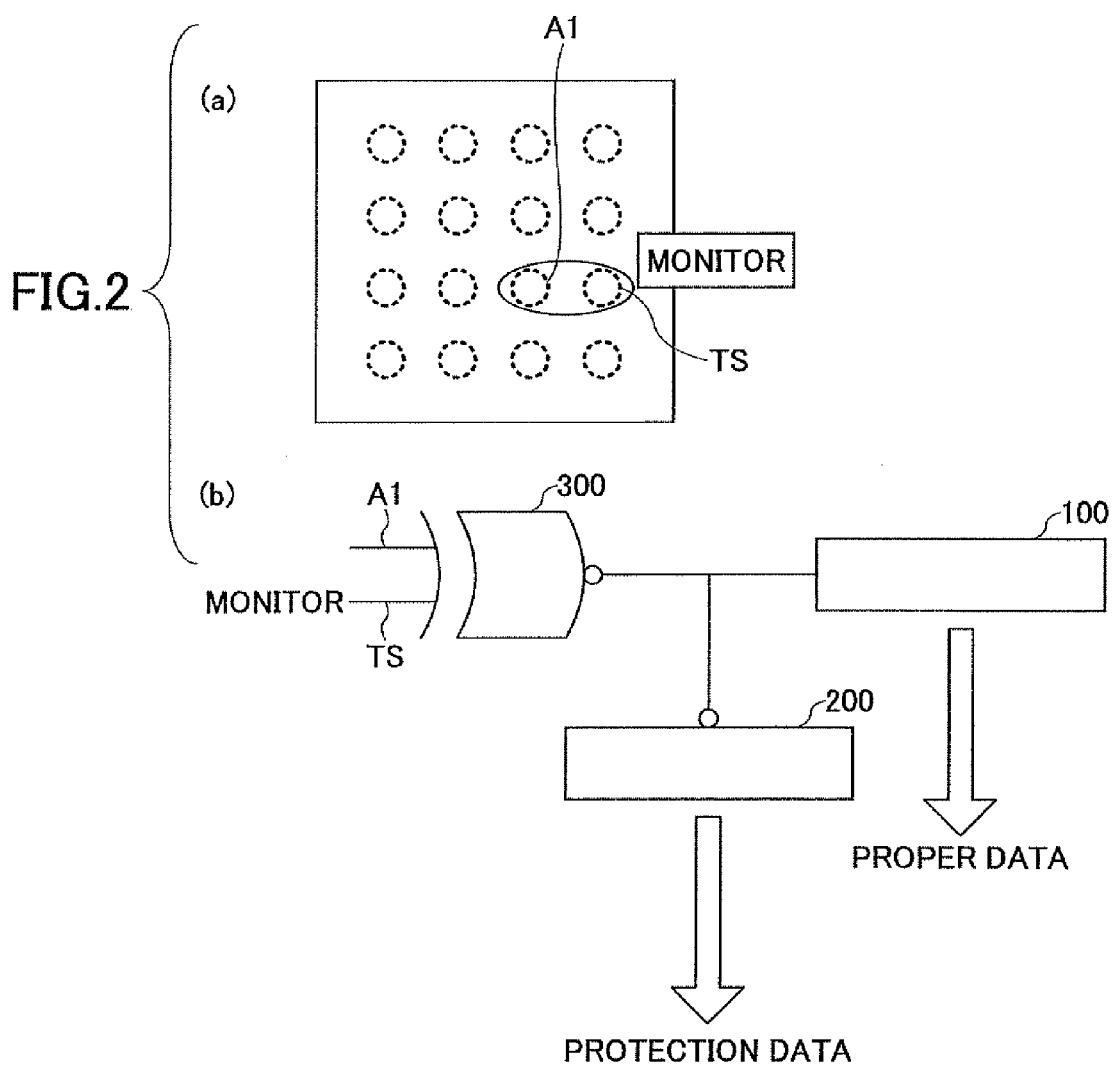
FIG. 2 shows a conceptual diagram of first and second embodiments of the present invention.

In the second mode of carrying out the present invention, as shown in FIG. 2 (*a*), other than an address terminal A1 for reading data, a predetermined connection monitor terminal TS is additionally provided to a data storage. Then, in a process where the data storage is mounted on a printed substrate, a solder bridge is produced for short-circuiting between the address terminal A1 and the connection monitor terminal TS.

The above-mentioned connection monitor terminal TS may be provided for each of respective address terminals, or, may be provided only for part of the address terminals.

For example, in a case of a BGA-type semiconductor device package, such a circuit short-circuited by means of a solder bridge cannot easily be found out by a third person. Therefore, when the third person attempts to remove this package from the printed substrate by melting solder, which connects terminals between the data storage and the printed substrate, without any special concern, the above-mentioned solder bridge connecting between the address terminal A1 and the connection monitor terminal TS is also removed accordingly without causing any notice by this person.

Thus, even when an unauthorized third person removes the data storage from the printed substrate for the purpose of illegal use or such, this person may, with a high possibility, remove the solder bridge short-circuiting the address terminal A1 and the connection monitor terminal TS unconsciously as the same time the person removes solder connecting a number of terminals connecting terminals between the semiconductor device as the data storage and the printed substrate.

It is noted that, as a part of a circuit configuration of the data storage, a table is provided, which is selected from a result of exclusive OR (EXOR) operation carried out between the above-mentioned specific address terminal A1 and the connection monitor terminal TS, and, by means of this table, proper addressing for reading data is made. As a result, as long as the address terminal A1 and the connection monitor terminal TS are short-circuited, these two terminals have equal signal levels, and thus, the exclusive OR operation therebetween results in an L level. The circuit configuration should be made such that, the table selected by this L level signal provides proper addressing.

On the other hand, when the short circuit bridge between these terminals A1 and TS is removed, they may have mutually different signal levels. As a result, the exclusive OR operation therebetween results in an H level. Another table may be selected from this H level signal preferably. By this other table, predetermined addressing other than the proper addressing may be carried out, whereby data different from proper data may be read out.

That is, as shown in FIG. 2 (b), when both terminals A1 and TS are short-circuited to have equal levels, an output L of an exclusive OR device 300 is inverted into an H level by an inverting function, and as a result, proper addressing is provided, whereby proper data is read out from a proper data storage part 100.

On the other hand, when the short circuit bridge between the terminals A1 and TS is removed, that is, when the data storage is removed from the printed substrate without a special concern for the purpose of illegal use or such, an output H of the exclusive OR device 300 is obtained and it is then inverted into an L level by the inverting function, whereby data (dummy data) is read out from a fraud detection data storage part 200 through addressing carried out in a manner different from the proper one.

As mentioned above, according to the second mode of carrying out the present invention, from the above-mentioned predetermined addressing (caused by the above-mentioned removal of the short circuit bridge) other than the proper addressing, predetermined dummy data is read out. Instead, a predetermined program may be executed as a result of the predetermined dummy data is read out. As a result, a control system of a general-purpose personal computer or such, which is applied by a third person to read data from the target data storage, may be controlled by this program or the dummy data itself. As a result, via a communication network such as the Internet, a notification signal is automatically generated for a predetermined organization. Then, this fact that the dummy data or the predetermined program has been thus read out is notified of to the predetermined organization as information of notifying that illegal reading or illegal use of information to be protected is thus executed, whereby the predetermined organization may take appropriate measures.

Further, a configuration may be made by which, the predetermined data (dummy data) read instead of the proper data from the addressing different from the proper addressing as mentioned above controls the control system of the general-purpose personal computer or such, which is applied by the third person to read data from the target data storage, whereby a caution message is displayed for this person who is carrying out the illegal reading or illegal use of the information to be protected from the target data storage.

Further, another configuration may be made by which, meaningless data is set, which imitates the proper data, to be read out, instead of the proper data from the predetermined addressing other than the proper addressing as mentioned above. Thereby, when the information is illegally used, a proper result cannot be obtained. Then, a further configuration may be made by which, this fact that the proper result cannot be obtained is detected externally. For example, for a case where the information to be protected includes fingerprint information or such for personal authentication, a configuration may be made by which, when an unauthorized third person obtains this information illegally and intends to apply it for illegal authentication, false and imitating authentication information (dummy data) is read out by the above-mentioned predetermined addressing other than the proper addressing. As a result, this unauthorized person cannot succeed in authentication, and this fact may be detected by an authentication organization, and as a result, the illegal use of the information to be protected may be detected.

It is noted that, in each of the above-described first and second modes of carrying out the present invention, all of the information to be protected should not necessarily be erased or replaced. That is, even when merely part of the information to be protected is be erased, destroyed or replaced, a purpose of preventing leakage of the information to be protected may be sufficiently achieved for some cases.

According to the above-mentioned respective modes of carrying out the present invention, since information to be protected is appropriately erased, destroyed or replaced as mentioned above, the information to be protected can be positively protected. As a result, leakage thereof can be positively prevented accordingly.

Furthermore, in each method according to the present invention described above, merely information to be protected is erased, destroyed or replaced. However, the data storage itself, as hardware, is not damaged at all. Accordingly, the data storage itself may be reused. Thus, the present invention is advantageous also in a resource conservation viewpoint.

Specific embodiments of the present invention will now be described.

Figure 3:
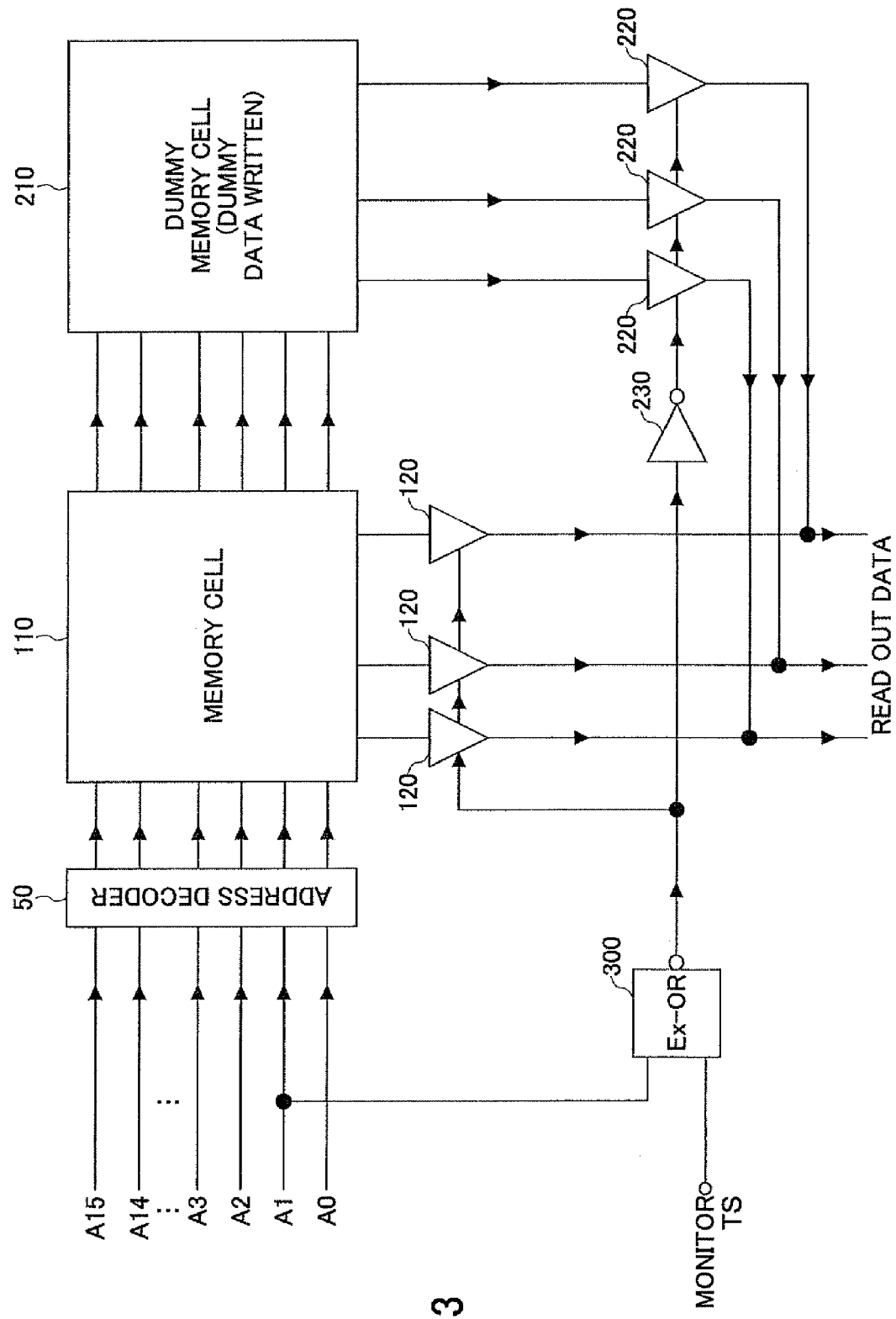
FIG. 3 shows a circuit diagram of a data storage according to the first embodiment of the present invention.

FIG. 3 shows a circuit diagram of a data storage in a first embodiment of the present invention.

As shown, the data storage includes an address decoder 50 responding to an address signal to provide a reading signal to a memory cell 110 or a dummy memory cell 210; the memory cell 110 storing proper data; the dummy memory cell 210 storing dummy data different from the proper data; an EXOR device 300 with an inverting function to carry out exclusive-or operation between signals on the address terminal A1 and the connection monitor terminal TS, and outputting an operation result after inverting with the inverting function; a gate device 120 passing the proper read data from the memory cell 110 in response to an H level output of the EXOR 300 with the inverting function; a gate device 220 passing the dummy read data from the dummy memory cell 210 in response to an H level signal inverted by an inverter 230 from an L level output of the EXOR 300 with the inverting function; and the inverter 230.

In the circuit configuration of FIG. 3, the same as in the case of the second mode of carrying out the present invention described above with reference to FIG. 2, both inputs of the EXOR device 300 with the inverting function have the same level in a state in which the address terminal A1 and the connection monitor terminal TS are short-circuited, i.e., in the proper mounted state, the EXOR device 300 with the inverting function outputs an H level. Thereby, the gate device 120 enters a passing state, while the gate device 220 responds to an L level inverted from the above-mentioned H level by the inverter 230 enters a blocking state. As a result, the proper data is read out from the memory cell 110.

On the other hand, when the short circuit bridge between the address terminal A1 and the connection monitor terminal TS is removed due to a cause that the data storage is removed from the printed substrate or such, as mentioned above for the second mode of carrying out the present invention, both inputs of the EXOR device 300 with the inverting function have different levels. As a result, the EXOR device 300 with the inverting function outputs an L level. Thereby, the gate device 120 enters a blocking state, while the gate device 220 responds to an H level inverted from the above-mentioned L level output enters a passing state. As a result, the dummy data is read out from the memory cell 210.

This dummy data is, as mentioned above, includes information for initiating automatic notifying operation for notifying the predetermined organization, information for initiating displaying operation for displaying a caution message to an operator, false and imitating authentication information or such.

Figure 4:
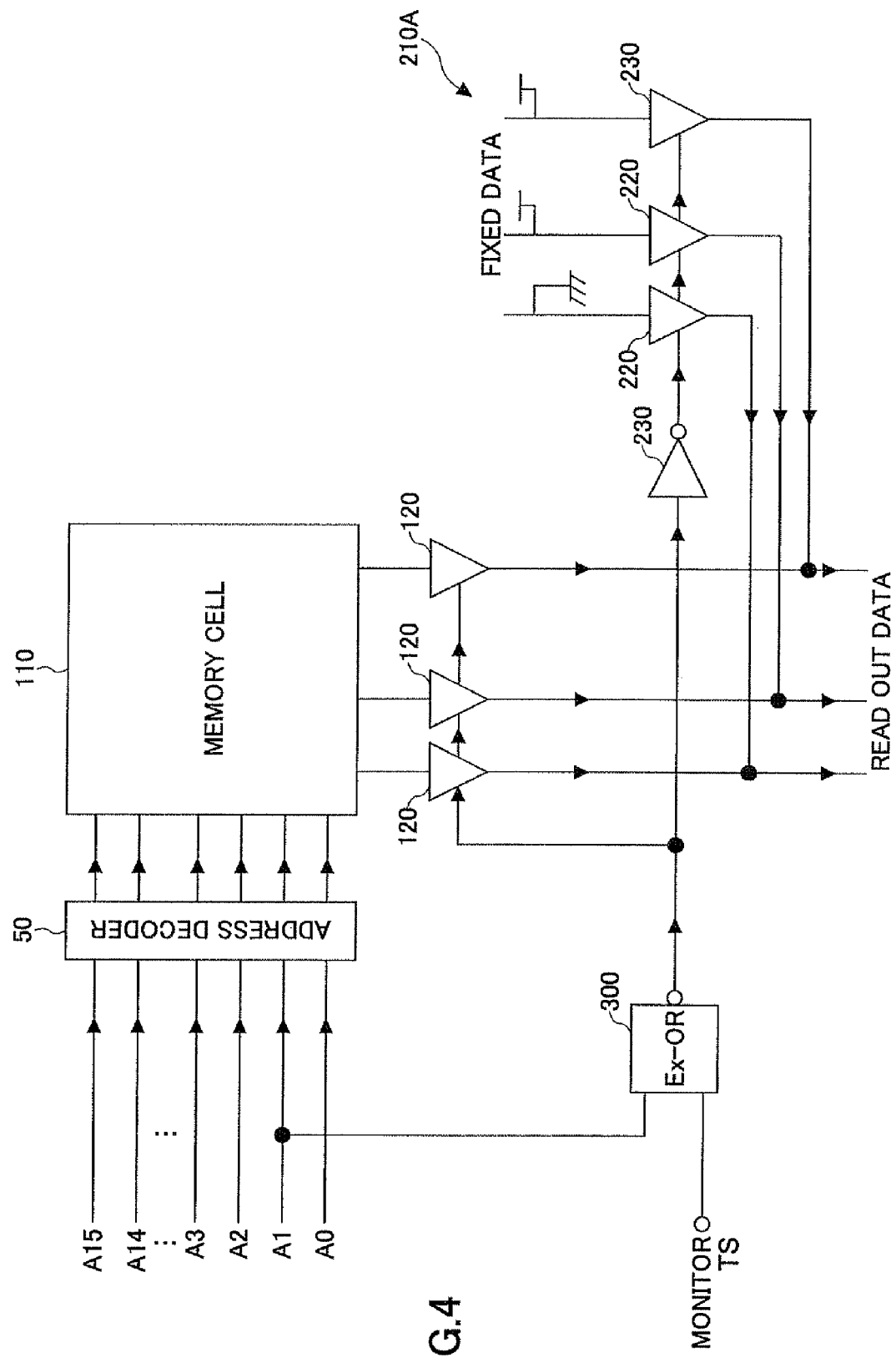
FIG. 4 shows a circuit diagram of a data storage according to the second embodiment of the present invention.

FIG. 4 shows a circuit diagram of a data storage in a second embodiment of the above-described first embodiment.

Since the second embodiment has approximately the same configuration as that of the first embodiment described above with reference to FIG. 3, duplicate description is omitted.

The second embodiment is different from the first embodiment in that a dummy data generating part 210A is provided instead of the dummy memory cell 210. The dummy data generating part 210A is a circuit for generating predetermined data. Specifically, each predetermined fixed signal level is generated from a connection to the ground, a connection to the power supply line, or such.

In this configuration of the second embodiment, when the short-circuit bridge between the address terminal A1 and the connection monitor terminal TS is removed due to a removal of the data storage for an illegal purpose or such, the L level output of the EXOR device 300 with the inverting function is inverted by the inverter 230, and the H level signal thus obtained causes the gate device 220 to enter the passing state, whereby a signal having the above-mentioned fixed signal level is read out from the dummy data generating part 210A.

Figure 5:
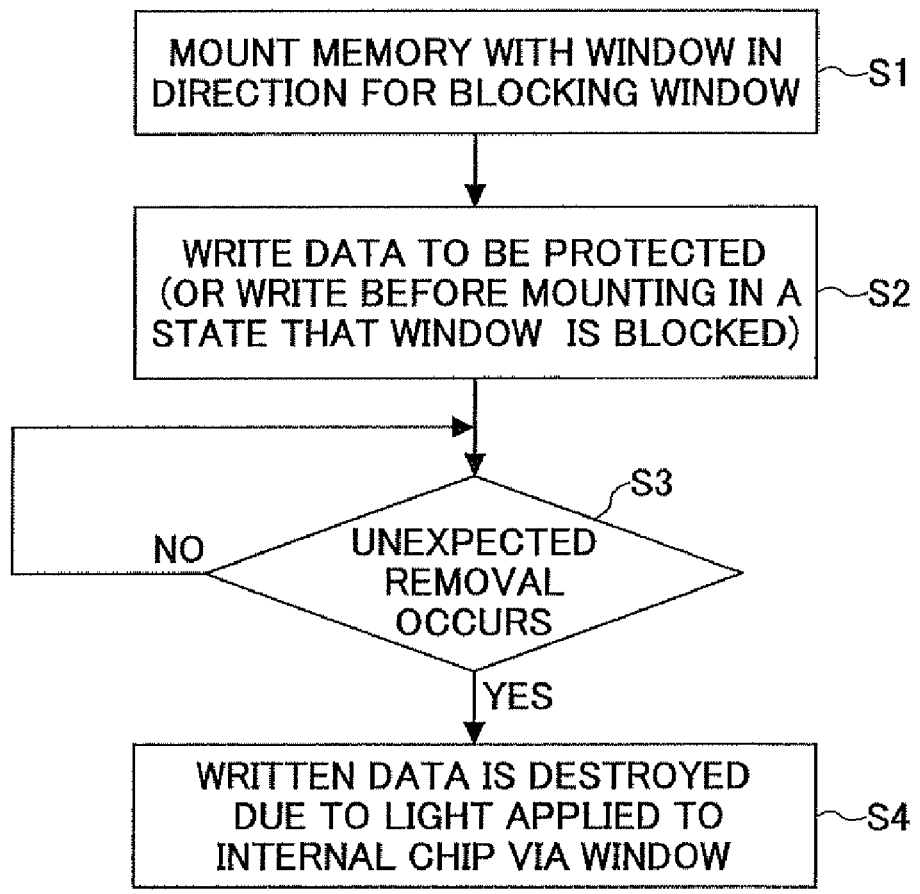
FIG. 5 shows a work and operation flow chart illustrating a third embodiment of the present invention.

FIG. 5 shows a flow chart illustrating a work and operation flow of a third embodiment corresponding to the above-described first mode of carrying out the present invention.

In the flow chart of FIG. 5, in Step S1, a memory with a window, in which a predetermined amount of hot carriers are previously injected as mentioned above, is mounted on a printed substrate in such a manner that the window is covered by the printed substrate. This memory with the window has a configuration such that a memory chip is covered by a package having a window, and, when the memory chip inside the package is exposed to outside light via the window, stored data in the memory chip is erased due to the function of the above-mentioned hot carriers.

In Step S2, in this state, predetermined information to be protected is written in the memory chip. Alternatively, the predetermined information to be protected is written in the memory in a state in which the window is covered, and after that, the memory is mounted on the printed substrate in such a manner that the window is covered as mentioned above so that the memory chip inside of the package is prevented from being exposed via the window.

In Step S3, when unexpected removal of the memory with the window occurs, that is, when the memory with the window is removed without such a special concern that the window is prevented from being uncovered, the stored data is destroyed as a result of the inside memory chip being exposed to outside light in Step S4. That is, the window of the package of the memory with the window is thus uncovered, whereby the memory inside the package is exposed to outside light, and the stored data in the memory chip is destroyed due to the function of the hot carriers injected therein as mentioned above.

As a result, leakage of the information to be protected can be positively prevented even when the data storage is thus illegally removed.

Figure 6:
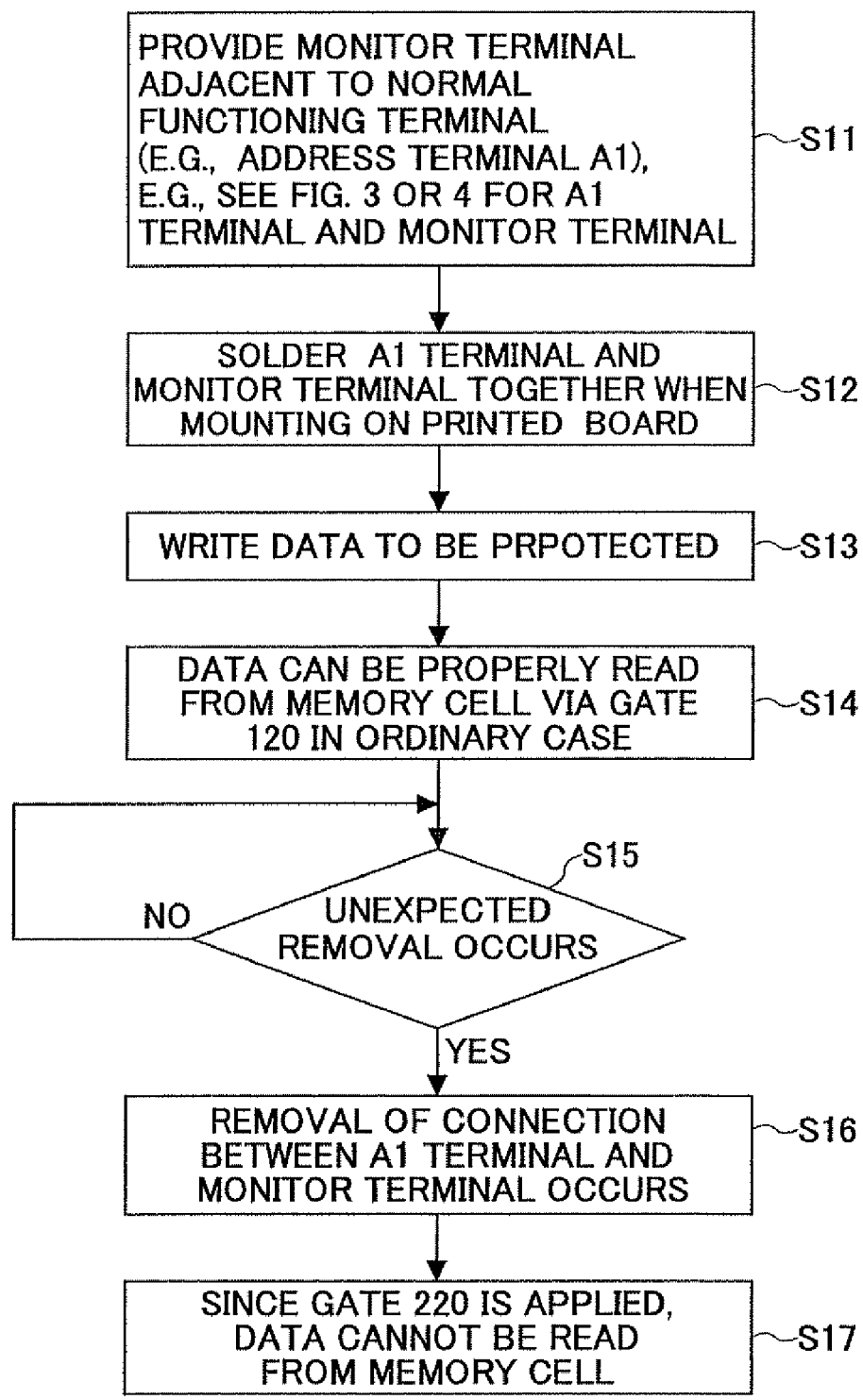
FIG. 6 shows a work and operation flow chart illustrating the first and the second embodiments of the present invention.

FIG. 6 shows a flow chart illustrating a work and operation flow of the first and second embodiments, described above with reference to FIGS. 3 and 4, corresponding to the above-described second mode of carrying out the present invention.

In FIG. 6, in Step S11, a data storage having a circuit configuration such as that shown in FIG. 3 or 4 is provided. In Step S12, when the data storage is mounted on a printed substrate, an address terminal A1 and a connection monitor terminal TS are short-circuited by a solder bridge.

In Step S13, in this state, information to be protected is written in a memory cell 110 of the data storage. In this state in which both terminals A1 and TS are thus short-circuited, only the gate device 120 enters the passing state as described above. As a result, the proper data (information to be protected), written in Step S13 as mentioned above, can be read from the memory cell 110 in Step S14.

In Step S15, when unexpected removal of the data storage from the printed substrate occurs, i.e., when solder connection, including the above-mentioned solder bridge short-circuiting the above-mentioned terminals A1 and TS, is removed and thus the data storage is removed from the printed substrate, the solder bridge is removed accordingly in Step S16.

As a result, only the gate device 220 enters the passing state as mentioned above since the short circuit between the terminals A1 and TS is thus removed, whereby both terminals may have different signal levels. Thereby, instead of the proper data, dummy data stored in the dummy memory cell 210 or fixed data generated by the dummy data generating part 210A is read out.

Thus, leakage of the information to be protected can be positively prevented even when the data storage is thus illegally removed.

Figure 7:
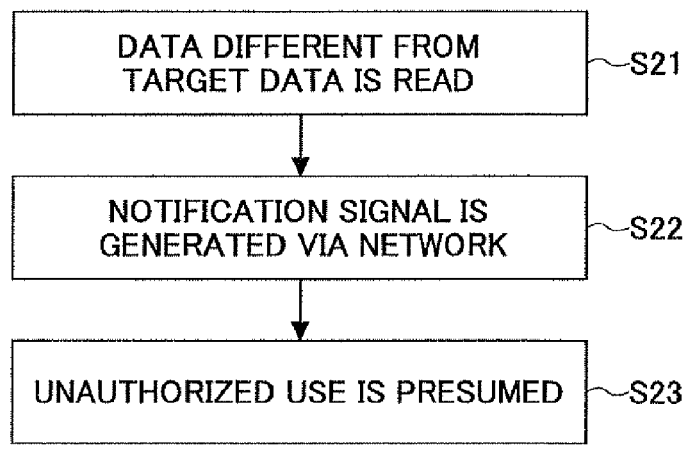
FIG. 7 shows an operation flow chart illustrating a fourth embodiment of the present invention.

FIG. 7 shows a flow chart illustrating an operation flow of a fourth embodiment of the present invention.

The fourth embodiment is a variant embodiment of the first or the second embodiment described above with reference to FIG. 3 or 4 of the present invention, providing a configuration by which dummy data read from the dummy memory cell 210 in the first embodiment or read from the dummy data generating part 210A in the second embodiment provides a specific function.

In Step S21 of FIG. 7, predetermined dummy data, different from proper data, is read out from the dummy memory cell 210 or from the dummy data generating part 210A of a target data storage in Step S17 of FIG. 6 as mentioned above. By a function of this dummy data, a control system of an apparatus, for example, a personal computer, which is operated by an unauthorized person for actually reading data from the target data storage, is automatically controlled. As a result, this apparatus automatically transmits a predetermined notification for a predetermined destination via a communication network such as the Internet in Step S22. As a result, the fact that the target data storage is thus used illegally by the unauthorized person can be found out.

Figure 8:
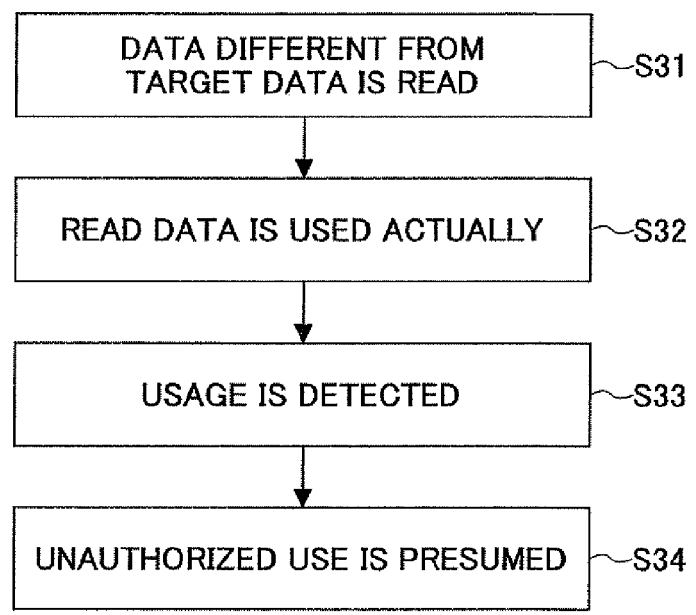
FIG. 8 shows an operation flow chart illustrating a fifth embodiment of the present invention.

FIG. 8 shows a flow chart illustrating an operation flow of a fifth embodiment of the present invention.

The fifth embodiment is another variant embodiment of the first or the second embodiment described above with reference to FIG. 3 or 4 of the present invention, providing another configuration by which dummy data read from the dummy memory cell 210 in the first embodiment or from the dummy data generating part 210A in the second embodiment provides another specific function.

In FIG. 8, in Step S31, predetermined dummy data, different from proper data, is read out from the dummy memory cell 210 or from the dummy data generating part 210A of a target data storage in Step S17 of FIG. 6 as mentioned above. A case will now be assumed where the proper data stored in the target data storage is authentication information, and, an unauthorized person who does not recognize that the data he or she thus obtains from the target data storage illegally is not the proper authentication information but dummy data.

In this case, in Step S32, when the unauthorized person actually applies this dummy data to obtain an authentication from a predetermined authentication apparatus, the authentication apparatus does not make proper authentication since the dumpy data is applied thereto as mentioned above. It is noted that the dummy data is configured so that the authentication apparatus which thus processes the dummy data can detect the fact that the illegal operation is thus made. As a result, the fact that the target data storage is thus used illegally by the unauthorized person can be found out.

Further, the present invention is not limited to the above-described embodiments, and variations and modifications may be made without departing from the basic concept of the present invention claimed below.

The present application is based on Japanese Priority Application No. 2005-299201, filed on Oct. 13, 2005, the entire contents of which are hereby incorporated herein by reference.

What is claimed is:

1. A data storage comprising a functioning part responsive to an unauthorized data reading operation attempted to be carried out on a storage part storing target data, to cause predetermined data, different from the target data, to be read out instead of the target data, wherein:

said functioning part responds to a data reading operation attempted to be carried out on the storage part storing target data for a case where said data storage is handled in a predetermined manner to cause predetermined data, different from the target data, to be read out instead of the target data, and is configured such that said functioning part causes addressing in a manner different from a proper manner when said data storage is handled in said predetermined manner, upon addressing said storage part; and predetermined external terminals are previously short-circuited, and a configuration is provided such that the short-circuit of the predetermined external terminals is removed when the data storage is handled in said predetermined manner, and said functioning part, which causes addressing in a predetermined manner, different from the proper manner, when said data storage is handled in said predetermined manner, carries out the proper addressing when said predetermined external terminals are short-circuited while carrying out the predetermined addressing, different from the proper addressing, when said short-circuit is removed.

2. The data storage as claimed in claim 1, wherein:
said predetermined data to be read out, instead of the target data, comprises information for automatically initiating a predetermined communication operation for notification.

3. The data storage as claimed in claim 1, wherein:
said predetermined data, read out instead of the target data, is configured in such a manner that, when said predetermined data is thus read out and then is actually used, the actual use is detected.

4. A data storage comprising a part functioning, in response to unauthorized addressing to perform a data reading operation, attempted to be carried out on a storage part storing target data, instead to cause dummy data, different from the target data, to be read out, wherein:

previously short-circuited external terminals, in response to authorized addressing of the functioning part to read out target data from the storage part, remain shod-circuited and cause the target data to be read out; and in response to unauthorized addressing of the storage part storing target data, the short-circuit of the external terminals is removed, causing the functioning part to carry out addressing different from the proper addressing and causing dummy data, different from the target data, to be read out.

5. The data storage as claimed in claim 4, wherein:
said dummy data comprises information automatically initiating a predetermined communication operation for notification.

6. The data storage as claimed in claim 4, wherein:
said dummy data, read out instead of the target data, is configured in such a manner that, when read out and actually used, causes the actual use to be detected.

* * * * *

UNITED STATES PATENT AND TRADEMARK OFFICE
CERTIFICATE OF CORRECTION

PATENT NO. : 7,505,316 B2
APPLICATION NO. : 11/740811
DATED : March 17, 2009
INVENTOR(S) : Osamu Ishibashi It is certified that error appears in the above-identified patent and that said Letters Patent is hereby corrected as shown below:

Column 10, Line 31, change "shod" to --short--.

Signed and Sealed this

First Day of September, 2009

David J. Kappos
*Director of the United States Patent and Trademark Office*